United States Patent [19]

Patrick

[11] Patent Number: 4,879,257

[45] Date of Patent: Nov. 7, 1989

[54] PLANARIZATION PROCESS

[75] Inventor: Roger Patrick, Palo Alto, Calif.

[73] Assignee: LSI Logic Corporation, Milpitas, Calif.

[21] Appl. No.: 122,245

[22] Filed: Nov. 18, 1987

[51] Int. Cl.⁴ .................... H01L 21/283; H01L 21/316
[52] U.S. Cl. ..................................... 437/195; 437/189; 437/246; 437/228; 437/978; 437/192; 148/DIG. 51; 148/DIG. 131; 148/DIG. 81; 156/659.1; 156/653
[58] Field of Search ............... 437/189, 187, 203, 225, 437/195, 192, 199, 245, 246, 228, 229, 978; 357/67, 71; 156/643, 653, 659.1, 652; 148/DIG. 51, DIG. 131, DIG. 81

[56] References Cited

U.S. PATENT DOCUMENTS

| | | | |
|---|---|---|---|
| 4,038,110 | 7/1977 | Feng | 437/978 |
| 4,470,874 | 9/1984 | Bartush et al. | 156/643 |
| 4,520,041 | 5/1985 | Aoyama et al. | 427/88 |
| 4,541,168 | 9/1985 | Galie et al. | 148/DIG. 131 |
| 4,541,169 | 9/1985 | Bartush | 148/DIG. 131 |
| 4,666,553 | 5/1987 | Blumenfeld et al. | 156/643 |
| 4,708,767 | 11/1987 | Bril | 437/18 |
| 4,708,770 | 11/1987 | Pasch | 156/662 |

Primary Examiner—Brian E. Hearn
Assistant Examiner—T. N. Quach
Attorney, Agent, or Firm—McCubbrey, Bartels, Meyer & Ward

[57] ABSTRACT

A method for forming a multilayer integrated circuit is described wherein the resultant top surface thereof is substantially planar. The method involves first forming a layer of connecting metallization on integrated circuit components formed in a conventional manner. Then a first layer of dielectric is formed on the metallization layer. Next a second dielectric layer is formed on the first dielectric layer. Via areas are then formed by etching the first and second dielectric layers in order to expose selected areas of the first metallization layer, and filled with metal to form vias. A layer of photoresist is deposited on all surfaces. Lastly, the surface is etched using an etchant that etches dielectric, metal and photoresist at substantially the same rate such that said vias are exposed and a planar top surface produced.

12 Claims, 3 Drawing Sheets

PLANARIZATION PROCESS

FIELD OF THE INVENTION

This invention relates to the field of integrated circuit processing and specifically to a method and means for fabricating multilayer integrated circuits having increased device density and interconnection flexibility.

BACKGROUND OF THE INVENTION

Integrated circuits are well known devices which provide complicated circuit structures on a single substrate or "chip". Since their inception, these devices have grown more complicated with increasingly large numbers of devices required for new applications. At the same time, the cost of these devices has dropped dramatically. One example of the trend in the integrated circuit industry is computer memory devices. Early memory devices contained the equivalent of one thousand memory cells on a single chip. Today, computer memory devices may contain a million or more memory cells. The corresponding cost per memory cell has dropped by at least an order of magnitude.

This trend exists in all phases of the integrated circuit industry. The ability to incorporate large numbers of devices on a single chip has fostered new classes of devices which were not possible with prior technology. Microprocessors and digital signal processors have appeared relatively recently and the complexity of these devices have pushed known process technologies to its limits. Early microprocessors were implemented as four and eight bit devices while current microprocessors have been developed with sixteen and thirty two bit data paths. This has resulted in a four-fold increase in circuit density.

One technique designers have used to fabricate more complex devices is to increase the size of the integrated circuit substrate. Another well known technique is to shrink the size of the individual components of the device. Each of these techniques has problems. For example, as the size of the integrated circuit substrate increases, processing yield decreases. This is because the silicon wafers used to manufacture the chips often have crystalline defects which may render components non-functional. Therefore, the size of a semiconductor chip may be limited by the defect density of the silicon wafer used to manufacture the chips.

Most known integrated circuit manufacturing processes rely in part on photolithographic processes which have a finite ability to produce small objects. In other words, the resolution of the photolithographic process limits the amount of reduction possible in producing small components. Furthermore, since the wavelength of light is relatively long with respect to semiconductor devices in the range of 1 micron, the wavelength of the light used in the photolithographic process also limits the size reduction possible with the process.

Another limiting factor with photolithographic processing is the alignment of the masks used to form the various layers of the device. A minute misalignment in these masks will produce unsatisfactory results. As device sizes grow even smaller, the alignment of the various masks grows more critical.

The processing environment for small semiconductor devices also becomes more critical as device size grows smaller. For example, a particle of material as small as 1 micron in the processing environment may render a small semiconductor device non-functional.

Another problem facing designers today is the fact that as devices grow more complicated, design cycles grow longer. This results in increased cost for producing a new design. However, competitive pressures demand that new designs be produced for lower cost per device than prior designs. As known techniques for increasing the density of integrated circuits have approached theoretical limits, designers have sought new methods for increasing the density and complexity of integrated circuits while providing a cost savings over prior designs In response to these demands, designers have turned to multilayer interconnection structures to provide greater flexibility in arranging the devices on the semiconductor substrate. One known multilayer interconnection technique is to deposit a first layer of interconnecting metallization on the integrated circuit. An insulating layer is then deposited over the first metallization layer. In some cases, the integrated circuit is planarized somewhat by addition of a layer of photoresist material and etching the photoresist and an insulating dielectric layer to planarize the device as much as possible. A series of holes are then etched through the insulating dielectric layer in the locations where interconnections are desired. Finally, a second layer of metallization is deposited over the first layer of metallization and insulating layer thus contacting the first metallization layer in the areas where the holes are etched in the insulating dielectric layer. The interconnections between the two metallization layers are referred to as "vias".

While this technique does provide increased flexibility in arranging components on the integrated circuit substrate, small detents or depressions are formed at the via locations and the top surface of the resulting device is not planar especially if the first layer of metal is on more than one level as will be discussed below. Since this surface is not planar it is not possible or at least very difficult to deposit any further interconnecting or device layers on the device. No technique is known which allows the deposition of one or more interconnecting layers while rendering the resulting device completely planar. A planar device is highly desirable because such a device would permit the creation of additional interconnecting or device layers and allow a virtually unlimited potential ability to vertically stack components on an integrated circuit substrate.

Furthermore, during photolithographic processing, in a non-planar device, it is difficult if not impossible to focus on all areas of the integrated circuit. In other words, some portions of the integrated circuit will be in focus while others will not. As additional layers are added, the effects of non-planarity are additive, thus compounding the above mentioned problems.

In devices where multilayer metallization is desired, non-planar devices pose another significant problem. This is especially true in MOS devices which employ field or insulating oxides between the individual devices. In this case, metal deposited over oxide areas will be at a different level than the metal over the device diffusions. The dielectric layer disposed over the metal and device layers will similarly have a surface at several different levels. Because of this level offset, vias etched on these different levels will have different widths. Specifically, the vias on the higher level will be etched wider than the vias on lower levels. The vias on the second level will have a higher aspect ratio than the vias on the first level creating problems when the second layer of metallization is deposited. Specifically, the via holes on the lower level may not be etched sufficiently to allow contact with the underlying metal or the via holes may not completely fill with metal when the metal is deposited on the integrated circuit. In other cases it may be necessary to overfill some via holes to insure all via holes are filled, thus compounding the non-planarity problem.

SUMMARY OF THE INVENTION

Briefly described, the present invention contemplates an improved planarization process which produce a substantially planar surface on an integrated circuit. In accordance with the present invention, the components of the integrated circuit may be formed using conventional processes. A layer of interconnecting metallization is then formed on the device. A first layer of dielectric material is then deposited over the first metallization layer. Next, a second layer of dielectric is formed over the first layer of dielectric. The second dielectric layer is then masked to permit etching in the areas where vias are to be formed and the two dielectric layers are etched to expose the first layer of metallization in the via areas. The etched areas are then filled with metal to form the vias. The entire device is then coated with a layer of photoresist material. Finally, the device is etched with a chemistry which etches photoresist, the metal layer, and the dielectric layers at the same rate. The device is sufficiently etched to expose the vias and the resulting top surface of the device will be substantially planar. This planar surface is readily adapted for receiving a second metallization layer or an additional device layer. The process may then be repeated to produce as many metallization or device layers as desired.

Accordingly, it is an object of the present invention to provide a method and means of producing a planar integrated circuit structure.

It is another object of the present invention to provide a method and means for increasing the device density of an integrated circuit.

It is still another object of the present invention to increase the flexibility of interconnecting devices on an integrated circuit.

It is another object of the present invention to provide a planar multilayer integrated circuit structure.

It is still another object of the present invention to increase the yield of integrated circuit processing.

It is still another object of the present invention to increase the reliability of an integrated circuit device.

It is another object of the present invention to provide a method and means of completely filling integrated circuit via holes of different depths while at the same time providing a substantially planar device.

It is yet another object of the present invention to provide a method and means of filling via holes in an integrated circuit while eliminating overfilled or underfilled via holes.

It is still another object of the present invention to provide a method and means of planarizing a multilayer integrated circuit structure while removing dielectric nucleation and residual metal from the resulting planar surface.

BRIEF DESCRIPTION OF THE INVENTION

These and other objects of the present invention may be completely understood through the following description and the accompanying drawings in which.

DETAILED DESCRIPTION OF THE DRAWINGS

Figure 1A:
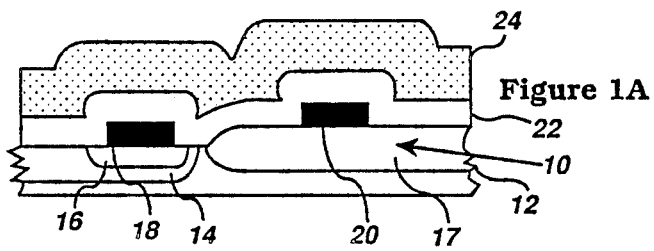
FIGS. 1A through 1E are a series of cutaway drawings depicting the preferred embodiment of the present inventive process.

The process of the present invention provides a planar integrated circuit structure which is readily adaptable for a multilayer integrated circuit structure. Referring now to FIGS. 1A through 1E, the present process begins with the formation of integrated circuit components 10 on a substrate 12 using any well known process. The present inventive process is compatible with virtually any type of integrated component such as bipolar or metal oxide or other field effect transistors, capacitors and resistors regardless of how they are formed. For the purposes of explanation, the device shown in FIG. 1A comprises a diode including a cathode 14 and an anode 16 underlying metal runner 18. An area of field oxide 17 may be disposed underlying metal runner 20. Since field oxides are "grown" in the silicon substrate, the upper surface of the field oxide may be offset with respect to the upper surface of diffusions 14, 16. While a single device is shown in FIGS. 1A through 1E, those skilled in the art will appreciate that multiple devices are typically formed in an integrated circuit. The present invention contemplates the formation of thousands and perhaps millions of devices on a single integrated circuit. A first layer of interconnecting metallization is then deposited and etched to form the metal runners 18 and 20. The formation of the metal runners is a well known process typical to all integrated circuit processes.

In one known process, a layer of metal such as aluminum is first deposited over the entire structure using a well known process such as sputtering. The metal layer is then masked with a photoresist material to permit etching only in the areas where metal is not desired. The following process could be employed to etch the metal layer and form metal runners 18, 20 using a plasma etch process:

Power 100–1000 watts
Pressure 100–800 mTorr
Gas Flow $Cl_2$, $BCl_3$, $S_iCl_4$ in the range of 50–200 sccm in a chlorine chemistry Those skilled in the art will appreciate that this process may be adjusted to accommodate other types of metal runners.

Once the first layer of metallization is formed, a first layer of dielectric 22 is deposited over the metal layer. The first dielectric layer may be silicon dioxide ($S_iO_2$) or some other insulating material which may be deposited with any well known process such as low pressure chemical vapor deposition. A second layer of dielectric material 24 is then deposited over the first dielectric layer. In the preferred practice of the present invention, the second dielectric layer may be formed of silicon nitride ($Si_3N_4$) although other dielectric materials may function satisfactorily.

Silicon nitride is especially advantageous in this application because it is desirable to use a dielectric material which may be etched at the same rate as the metal which is used to fill the vias and the corresponding oxide layer. However, because of the chemical properties of silicon and silicon nitride, it is not desirable to deposit the silicon nitride directly on the silicon substrate and therefore the first dielectric layer separates the silicon nitride from the silicon substrate. This layer provides the further advantage of providing a means of removing any residue of conductive material in unwanted areas if the selective deposition process described below is employed, since the top dielectric layer will be substantially etched away in a later step. Since two layers of dielectric are employed, the etching process described below may be adjusted to etch the upper dielectric layer at a relatively rapid rate while etching the lower dielectric layer at a relatively slow rate, thus providing greater control over the present inventive process.

Once the two layers of dielectric are formed, the surface of the second dielectric layer is masked to permit etching in the areas where vias are to be formed. This is done by selectively depositing a photoresist material such as Riston, manufactured by DuPont, on the areas which are not to be etched while leaving exposed the areas to be etched. The two dielectric layers are then etched to expose the metal runners 18, 20 in the desired area 26 with the following process in a low pressure, Hexode reactor:

Power: 1000–1500
Pressure: 10–100 mTorr
Gas Flow: $CHF_3$, $CF_4$, Oxygen

Figure 1B:
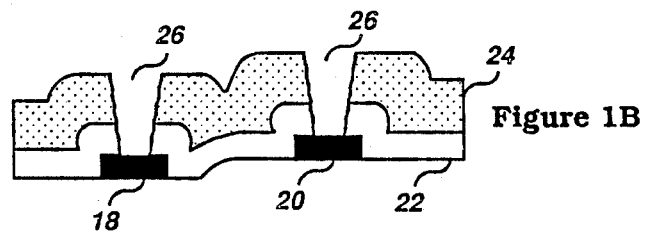
Figure 1C:
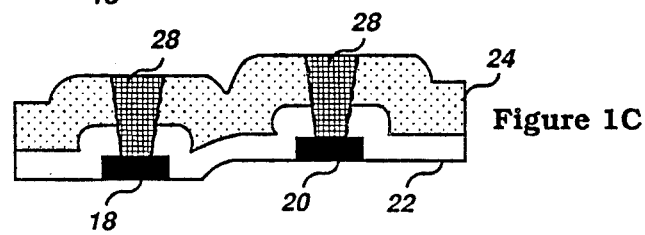

The structure resulting from this etching step includes cavities 26 which expose the metal runners 18, 20 below the dielectric layers as shown in FIG. 1B. The next step is to fill cavities 26 with metal plugs 28 as shown in FIG. 1C. In the preferred practice of the present invention, metal plugs 28 may typically be tungsten and may be deposited with a process known as selective chemical vapor deposition. Tungsten is particularly advantageous in this application because the coefficient of thermal expansion of this metal matches that of silicon and silicon bearing compounds and it can be deposited selectively. Other metals such as aluminum or other materials such as polysilicon may also function satisfactorily in this application. A process for selective chemical vapor deposition of tungsten which would function satisfactorily in the practice of the present invention is described in Blewer, Progress in LPCVD Tungsten for Advanced Microelectronics Applications, Solid State Technology, November 1986. The selective chemical vapor deposition of tungsten may be achieved by the following low pressure chemical vapor deposition process:

Pressure: <1 Torr
Gas Flow: $WF_6$ and 3 Hz or $2WF_6$ and $3S_i$
Temperature: 300°

Figure 1D:
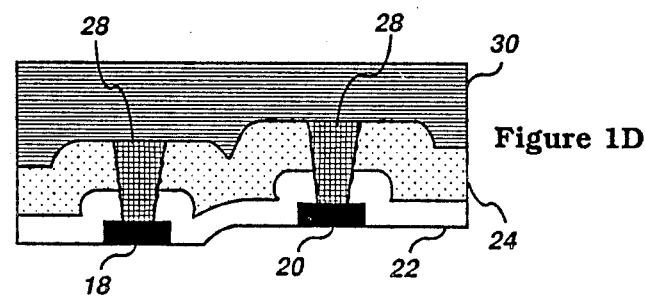

Once the metal areas 28 have been deposited, the entire structure is coated with a layer of photoresist 30, such as Riston. Prior to the deposition of the photoresist, the surface of the integrated circuit structure will be irregular. The photoresist is deposited in a manner which conforms to these irregularities and is deposited in sufficient quantities such that the resulting top surface of the photoresist layer is substantially flat. This is achieved by a well known process referred to as spinning. The resulting structure at this point is depicted in FIG. 1D.

Figure 1E:
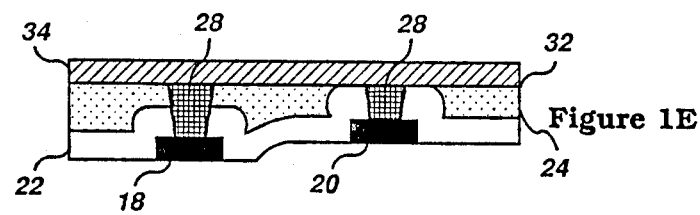

The next step of the present inventive process is to etch the structure to planarity. This is achieved by adjusting the etching chemistry to etch the photoresist, tungsten and the dielectric layers at the same rate. This is achieved in a parallel plate plasma etcher using, in the case of tungsten or polysilicon conductors, a fluorine based chemistry in the following process:

Power: 100–1000 Watts
Pressure: 100–800 mTorr
Gas Flow: $NF_3$, $SF_6$ or $CF_4$ in the range of 50–200 sccm with a dilutent of He or Ar in the range of 50–200 sccm Process selectivity is controlled by adding $O_2$ in the range of 50–200 sccm The structure which results from this process step is shown in FIG. 1E. As can be seen in FIG. 1E, the structure of FIG. 1D is etched to expose the metal vias 28 and until the top surface 32 of the integrated circuit structure is completely planar. Since two layers of dielectric are employed, even partially filled vias may be etched to planarity. The planar surface 32 is readily adapted for receiving another layer of materials such as a layer of metal 34 which could be used to interconnect other components on the integrated circuit. In the alternative, another device layer could be formed by depositing a semiconductor material such as polysilicon. Those skilled in the art will appreciate that the present process is readily adapted for combining multiple device types in an integrated circuit. For example, bipolar devices could be formed in the integrated circuit substrate and interconnected with a first layer of metallization. The device would then be planarized and vias formed in the appropriate locations in accordance with the present invention. A device layer of resistors or capacitors devices could then be formed on the planarized surface. Another metallization layer could then be formed on the second device layer and the process could be repeated as many times as desired. The present invention could also be employed to create active devices on multiple integrated circuit layers.

Figure 2A:
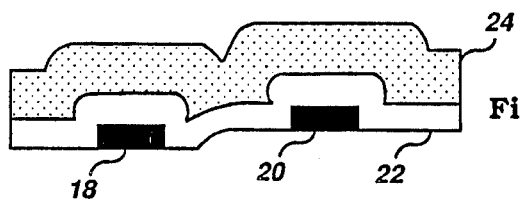
FIGS. 2A through 2E are a series of cutaway drawings depicting another embodiment of the present inventive process.
Figure 2B:
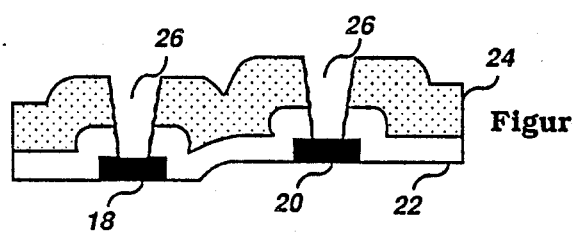

While the process described above was disclosed in the context of selective chemical vapor deposition of tungsten, the present inventive process is readily adapted for use with non-selective processes and other metals such as aluminum. Referring now to FIGS. 2A through 2E there is shown another embodiment of the present invention. According to this aspect of the invention, the integrated circuit is prepared as described in conjunction with FIGS. 1A and 1B. These steps are represented in FIGS. 2A and 2B. However, instead of the selective chemical vapor deposition process described above with reference to FIGS. 1A–1E, a layer of metal 36 is deposited over the entire structure of FIG. 2B resulting in the structure shown in FIG. 2C. This embodiment of the present invention contemplates the use of a non-selective deposition process and provides the advantage that the need for a selective deposition process is eliminated, thus allowing the use of other metals such as aluminum to form the metal plugs. The process used to deposit this metal layer may be identical to the process used to form the metal runners 18 and 20.

Figure 2C:
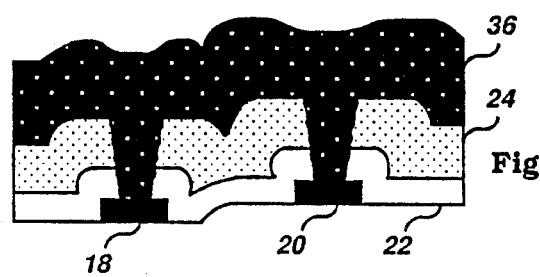
Figure 2D:
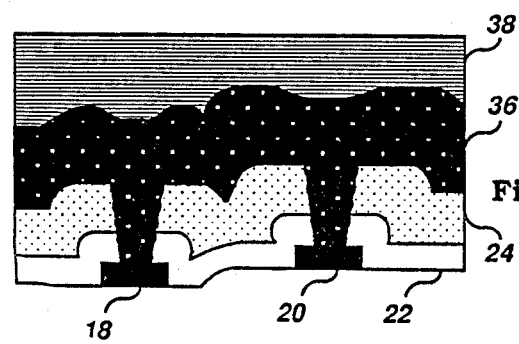
Figure 2E:
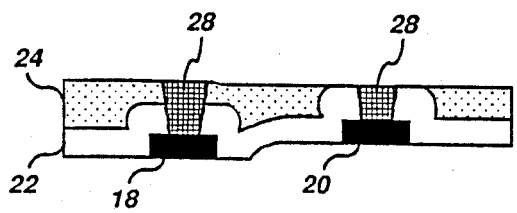

The next step is to deposit a layer of photoresist 38 over the structure of FIG. 2C in the manner described in conjunction with FIG. 1C to produce the structure shown in FIG. 2D. The layer of photoresist is then etched as described above to produce the resulting structure of FIG. 2E. As above, the structure of FIG. 2E is readily adapted to receive an additional metal or device layer.

Figure 3:
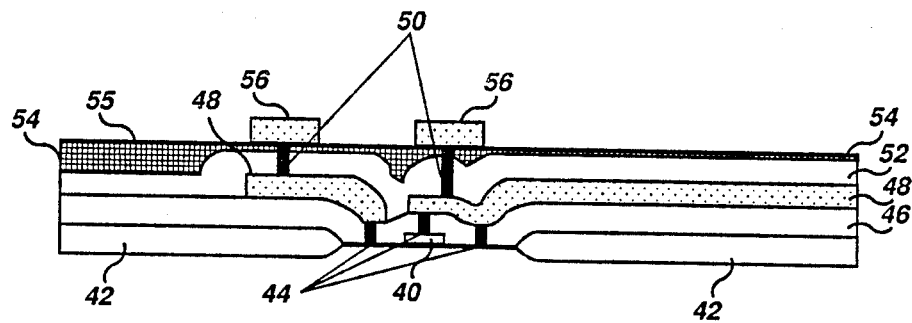
FIG. 3 is a cutaway diagram depicting a possible interconnected structure produced by the present inventive process.

Referring now to FIG. 3, there is shown an integrated circuit structure which may be formed with the present invention This structure comprises a CMOS cell including a diffusion of polysilicon 40 disposed between field oxide diffusions 42. A series of filled contacts 44 are then formed in the layer of insulating material 46. The filled contacts may then be interconnected with a first layer of metal 48. The cell may then be processed using the present process to form vias 50 in the dielectric layers 52, 54 and the resulting top surface 55 of dielectric layer 54 will be substantially planar. The structure may then be further processed to provide a second layer of metal 56 or additional device layers (not shown).

In summary, embodiments of an improved planar integrated circuit structure has been described. The present invention provides a method and means for producing an integrated circuit having multiple metallization layers or multiple device layers. Accordingly, other embodiments will be apparent to a person of ordinary skill in the art. All of such embodiments are intended to be within the scope of the present invention.

What is claimed is:

1. A method for manufacturing a multilayer integrated circuit comprising:
   (a) forming a plurality of components on an integrated circuit substrate to form a first component layer;
   (b) forming a first layer of interconnecting metallization over said components;
   (c) depositing a first layer of dielectric material over said first metallization layer;
   (d) depositing a second layer of dielectric material over said first layer of dielectric material;
   (e) masking said second dielectric layer wherein said mask permits etching in those areas where a contact with said first layer of interconnecting metallization is desired;
   (f) etching to form cavities through said first and second dielectric layers wherein said cavities expose said first layer of interconnecting metallization in those areas where contact with said first layer of interconnecting metallization is desired;
   (g) filling said cavities with metal to form metal filled cavities;
   (h) depositing a layer of photoresist over said second dielectric layer and said metal filled cavities; and
   (i) etching the integrated circuit with a chemistry which etches dielectric, metal and photoresist at substantially the same rate wherein said etching removes said photoresist and portions of said dielectric and metal filled cavities to expose said metal filled cavities and produce a top surface on said integrated circuit which is substantially planar.

2. The method of claim 1 further including the steps of depositing a second interconnecting metallization layer on said planar surface wherein said second metallization layer contacts said metal filled cavities in selected areas.

3. The method of claim 1 further including the steps of depositing a second component layer on said planar surface wherein the component of said second component layer contact said metal filled cavities in selected areas.

4. The method of claim 1 wherein the metal used to fill said cavities is tungsten.

5. The method of claim 1 wherein said first dielectric layer is silicon dioxide.

6. The method of claim 1 wherein said second dielectric layer is silicon nitride.

7. The method of claim 1 wherein the metal used to fill said cavities is aluminum.

8. The method of claim 1 wherein said step of filling said cavities includes the step of filling said cavities by the selective low pressure chemical vapor deposition of tungsten.

9. The method of claim 1 wherein said step of filling said cavities includes the step of filling said cavities by the non-selective deposition of aluminum.

10. The method of claim 9 wherein said aluminum is deposited by sputtering.

11. A method for manufacturing a multilayer integrated circuit comprising:
   (a) forming a plurality of components on an integrated circuit substrate to form a first component layer;
   (b) forming a layer of interconnecting metallization over said components;
   (c) depositing a first layer of dielectric material over said metallization layer;
   (d) depositing a second layer of dielectric material over said first layer of dielectric material;
   (e) masking said second dielectric layer wherein said mask permits etching in those areas where a contact with said first layer of interconnecting metallization is desired;
   (f) etching to produce cavities through said first and second dielectric layers wherein said cavities expose said first layer of interconnecting metallization in those areas where contact with said first layer of interconnecting metallization is desired;
   (g) filling said cavities with metal to form metal filled cavities;
   (h) depositing a layer of photoresist over said second dielectric layer and said metal filled cavities;
   (i) etching the integrated circuit with a chemistry which etches dielectric, metal and photoresist at substantially the same rate wherein said etching removes said photoresist and portions of said dielectric and metal filled cavities to expose said metal filled cavities and produce a top surface on said integrated circuit which is substantially planar;
   (j) depositing another interconnecting metallization layer on said planar surface wherein said metallization layer contacts said metal filled cavities in selected areas; and
   (k) Repeating steps (c) through (j) to form additional layers of interconnecting metallization patterns.

12. A method for manufacturing a multilayer integrated circuit comprising:
   (a) forming a plurality of components on an integrated circuit substrate to form a first component layer;
   (b) forming a layer of interconnecting metallization over said components;
   (c) depositing a first layer of dielectric material over said metallization layer;
   (d) depositing a second layer of dielectric material over said first layer of dielectric material;
   (e) masking said second dielectric layer wherein said mask permits etching in those areas where a contact with said first layer of interconnecting metallization is desired;

(f) etching to produce cavities through said first and second dielectric layers wherein said cavities expose said first layer of interconnecting metallization in those areas where contact with said first layer of interconnecting metallization is desired;

(g) filling said cavities with metal to form metal filled cavities;

(h) depositing a layer of photoresist over said second dielectric layer and said metal filled cavities;

(i) etching the integrated circuit with a chemistry which etches dielectric, metal and photoresist at substantially the same rate wherein said etching removes said photoresist and portions of said dielectric and metal filled cavities to expose said metal filled cavities and produce a top surface on said integrated circuit which is substantially planar;

(j) forming another device layer on said planar surface wherein said device layer contacts said metal filled cavities inselected areas; and (k) repeating steps (c) through (j) to form additional device layers.

* * * * *